United States Patent
Kobashi et al.

(10) Patent No.: US 6,198,218 B1
(45) Date of Patent: Mar. 6, 2001

(54) ORGANIC LIGHT EMITTING DEVICE USING DIAMOND FILM

(75) Inventors: Koji Kobashi; Yoshihiro Yokota; Takeshi Tachibana; Kazushi Hayashi; Maki Hamaguchi, all of Kobe; Katsumi Yoshino, Kishiwada, all of (JP)

(73) Assignee: Kabushiki Kaisha Kobe Seiko Sho, Kobe (JP)

(*) Notice: Subject to any disclaimer, the term of this patent is extended or adjusted under 35 U.S.C. 154(b) by 0 days.

(21) Appl. No.: 09/215,297

(22) Filed: Dec. 18, 1998

(30) Foreign Application Priority Data

Dec. 18, 1997 (JP) .................................................. 9-349537

(51) Int. Cl.$^7$ ...................................................... H01J 1/62
(52) U.S. Cl. .................................................... 313/504
(58) Field of Search .................................... 313/309, 336, 313/502, 504, 506, 509, 512; 257/13, 77, 94; 117/89, 95, 929

(56) References Cited

U.S. PATENT DOCUMENTS 5,334,855 * 8/1994 Moyer et al. ........................... 257/13
5,863,324 * 1/1999 Kobashi et al. ........................ 117/89

FOREIGN PATENT DOCUMENTS

| | | |
|---|---|---|
| 59-27754 | 7/1983 | (JP) . |
| 61-3320 | 1/1984 | (JP) . |
| 6-111938 * | 4/1994 | (JP) . |

* cited by examiner

Primary Examiner—Ashok Patel
Assistant Examiner—Todd Reed Hopper
(74) Attorney, Agent, or Firm—Oblon, Spivak, McClelland, Maier & Neustadt, P.C.

(57) ABSTRACT

An organic LED is provided that can stably and efficiently emit light as a result of a heat resistant hole drift layer. The organic LED can include, in order, a substrate, a hole injection electrode layer, a hole drift layer, an organic light emitting layer, an electron drift layer and an electron injection electrode layer. The hole drift layer comprises a diamond film with a boron concentration of between about $1.0 \times 10^{19}$ and about $1.0 \times 10^{21}/cm^3$. An optically transparent layer can be formed on the electron injection electrode layer.

12 Claims, 2 Drawing Sheets

F I G. 1
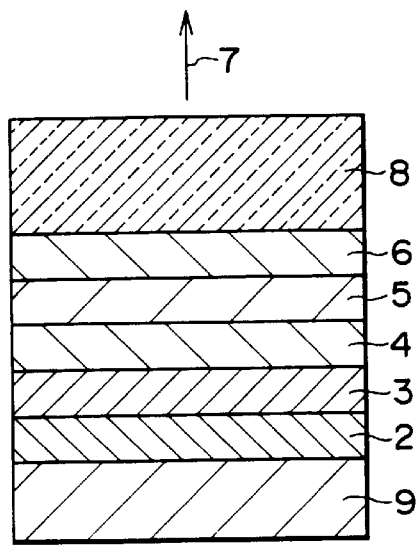
F I G. 2
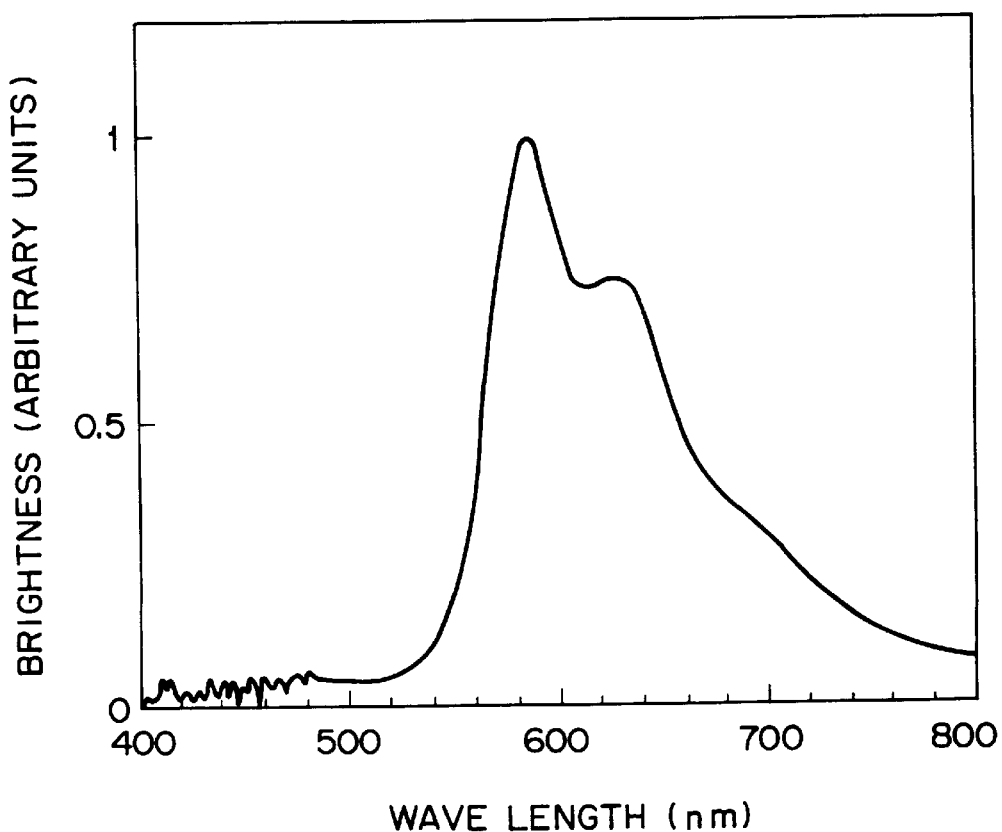

ORGANIC LIGHT EMITTING DEVICE USING DIAMOND FILM

BACKGROUND OF THE INVENTION

1. Field of the Invention

The present invention is related to an organic light emitting device (LED) and a method of producing an organic LED which possesses a stable light emission with a high efficiency. The present invention can be used for LEDs in display, a back light for a liquid crystal display, a flat light source, a flat panel display, etc.

2. Description of the Background

Diamond is known to have excellent resistance to high temperatures and has a large band gap (5.5 eV). Furthermore, diamond has excellent electrical properties such that the breakdown voltage is high, the saturation velocities of carriers (electrons and holes) are also high, and the dielectric constant, and hence the dielectric loss, is small. It is also well known that diamond has both the highest thermal conductivity among all materials at room temperature and a small specific heat.

Regarding chemical vapor deposition (CVD) of diamond films, the following techniques are known: microwave plasma CVD (for example, see Japanese patents (kokoku) Nos. Sho 59-27754 and Sho 61-3320), radio-frequency plasma CVD, hot filament CVD, direct-current plasma CVD, plasma-jet CVD, combustion CVD, and thermal CVD. By those techniques, it is possible to form continuous diamond films over large areas at low cost on substrates which consist of non-diamond materials.

To deposit a diamond film by CVD, hydrocarbon gas, such as methane, diluted with hydrogen is used as the source gas, and an electrically insulating diamond film can be formed. It is also well known that a p-type semiconducting diamond film can be formed by adding a gas comprising boron (B) atoms, such as diborane($B_2H_6$), in the source gas.

Recently, a field-emission (FE)-type light emitting element, which consists of an electrode coated with a fluorescent material that is facing to a diamond film in vacuum, was proposed. The element uses a light emission from the fluorescent material excited by electrons which have been injected into the vacuum from the diamond film and accelerated under a high voltage between the diamond film and the fluorescent electrode.

However, in the FE-type light emitting element, vacuum is necessary, and further there are problems that the structure of the device and the process to manufacture the device are complicated. Moreover, a high voltage, e.g., 5 to 10 kV, must be applied between the diamond film and the fluorescent material to accelerate electrons in the operation of the element. Therefore, it is necessary that the system containing the FE-type light emitting element must handle a high voltage, and thus the cost of the system is high.

To solve those problems, an organic LED which possesses a light emission at low voltage was proposed. This is referred to as Prior Art 1. FIG. 4 shows a cross-sectional view of such an organic LED. As shown in FIG. 4, an electrode for hole injection 12 is formed on a glass substrate 11. On the electrode 12, a hole drift layer 13 and a hole injection layer 18 are formed successively. On the hole injection layer 18, an organic light emitting layer 14 and an electron drift layer 15 are formed successively. Further, an electrode for electron injection 16 is formed on the electron drift layer 15. Note that the hole injection layer 18 and the electron drift layer 15 can be omitted depending on the specification of the LED.

As an organic compound to compose the organic light emitting layer 14, distyreallylene group, oxadiazole group, pyrazoloquinoline group, benzooxazole Zn compound group, and aluminum chelate compound can be used. Alternatively, polymer groups such as polyalkylthiophene, polyparaphenylenevinylene, polynaphthalene-vinylene, polyalkylfluorene, polyphenylene, and polymethylphenvlsilane can also be used.

Either a transparent electrode film, such as ITO (Indium-Tin-Oxide) or a metal film, such as Au and Ni, which has a large work function, is used as an electrode for hole injection 12. As the electrode for electron injection 16, a material film which has a small work function, such as Mg, Li, and Ca group, or their alloys with Ag or Al, is used. An organic compounds using the amine group is used for the hole drift layer 13, and an organic compound film including the amine group or the phutalocyanine group is used for the hole injection layer 18. As the electron drift layer 15, a film including an aluminum chelate is used.

In the organic LED which was configured as described above, electrons are injected from the electrode 16, and at the same time, holes are injected from the electrode 12. These electrons and holes recombine in the organic light emitting layer 14 and cause a light emission 17 from the side of the glass substrate II. The organic LED according to Prior Art 1 is characterized by the fact that the light emission is achieved at low voltage, and an arbitrary color of light can be obtained by selecting the organic compound to compose the organic light emitting layer 14.

However, there is a problem in the organic LED according to Prior Art 1 that the brightness of light emission is lower than that of the LED utilizing semiconductor, plasma, or field emission. This is attributed to the fact that the hole drift layer 13 and the electron drift layer 15 are composed of organic compounds. In particular, when an organic compound is used as a material for the hole drift layer 13, the drift mobility and carrier life time are low and hence the brightness of light emission also is low. When the amount of current is increased to increase the brightness of light emission, the temperature of the organic light emitting layer 1.4 reaches above over 100° C. This causes a problem that the organic compound layers composing the organic LED are thermally deteriorated.

An organic LED which possesses a high brightness at low current, was proposed in Japanese patent (kaikoku) Hei 6-111938. This will be referred to as Prior Art 2. The structure of the LED is similar to that of the organic light emitting element shown in FIG. 4, and will be explained using the figure. As shown in FIG. 4, an electrode for hole injection 12 is formed on a glass substrate 11 and then a hole drift layer 13 is formed on the electrode 12. An organic light emitting layer 14 and an electron drift layer 15 are successively formed on the hole drift layer 13. Further, an electrode for electron injection 16 is formed on it. A hole drift layer 13 consists of a boron-doped diamond layer in Prior Art 2.

In the organic LED configured as described above, holes injected from the electrode for hole injection 12 and electrons injected from the electrode for electron injection 16 recombine in the organic light emitting layer 14 and the light 17 is emitted from the side of the glass substrate 1. In this case, thermal deterioration of the hole drift layer 13 can be avoided, because the hole drift layer 13 consists of a diamond layer which is resistant to high temperature. In the diamond film, carrier (electron and hole) mobility is high. For example, the hole mobility in diamond ranges from 500 to 1870 $cm^2$/V-s. Thus, many holes can be transported to the organic light-emitting layer 14 through the hole drift layer 13 composed of a diamond film, and the light emission efficiency can be improved. Moreover, since the bandgap of diamond is larger than the energy level of the exciton (electron-hole pair) created by the recombination of injected electrons and holes, the exciton can not be annihilated by drifting to the diamond film. This mechanism also increases the light emission efficiency.

However, even in the case that the hole drift layer is a diamond film as shown in Prior Art 2, the light emission efficiency can not be improved sufficiently without choosing proper growth conditions for diamond film. For instance, in Prior Art 2, the diamond film for the hole drift layer was deposited by hot filament CVD. Because of this, the deposited diamond films contain the filament materials (W or Ta) as impurities which cause crystal defects in diamond and hence reduce the light emission efficiency.

In Prior Art 2, an ITO film as an electrode for hole injection 12 is deposited on a glass substrate 1 and the diamond film as a hole drift layer is formed on the ITO film. However, for diamond CVD, the substrate temperature must be higher than 750° C. in the atmosphere of chemically active hydrogen gas. Under these conditions, the ITO film is deteriorated or peeled off from the glass substrate during the diamond CVD. Even if a diamond film is deposited on the ITO film, the diamond film becomes polycrystalline, and since the carrier mobility of polycrystalline diamond film is known to be very low, the light emission efficiency can not be sufficiently improved.

The present invention is proposed to solve those difficult problems. It is an object of the present invention to provide an organic LED and a method of producing the organic LED which can make possible a stable light emission with a high efficiency without thermal deterioration of the hole drift layer.

SUMMARY OF THE INVENTION

The organic LED of the present invention has the following features: it consists of (i) a substrate, (ii) an electrode for hole injection which is formed on the surface of said substrate, (iii) a hole drift layer which is formed on the surface of said electrode for hole injection, (iv) an organic light emitting layer which is formed on the surface of said hole drift layer, and (v) an electrode for electron injection which is formed on the surface of said organic light emitting layer, where said hole drift layer is a B-doped diamond film in which the B concentration is between about $1.0 \times 10^{19}$ and about $1.0 \times 10^{21}/cm^3$.

It is preferred that the thickness of the diamond film is between about 0.5 $\mu$m and about 5 $\mu$m. It is also preferred that the crystallographic orientation of the diamond film along the diamond film thickness is (111), (100) or (110). It is most preferable that the diamond layer is a single crystal.

Moreover, it is preferred that the surface (1 $\mu$m deep from the top) of the diamond layer is lightly boron-doped, i.e., the B concentration at the surface of the diamond layer is lower than the rest of the diamond layer. It is also preferable that the surface of the diamond film, which is in contact with said organic light emitting layer, is chemically modified. For example, the chemical modification includes at least one kind of atom or atomic group chosen from a group of hydrogen, oxygen, halogen, hydroxyl group, cyano group, amino group, carboxyl group, sulfate group, nitro group, azo group, diazo group, and other higher molecular-weight compound.

It is possible that said substrate is one kind material chosen from a group of silicon, silicon nitride, silicon carbide, alumina, aluminum nitride, and metals which are resistant to high temperature. Alternatively, the substrate can include a temperature resistant material on which a film is deposited using a material selected from the above group.

It is preferred that the concentration of diborane included in the source gas is about 1 to about 20 volume ppm. By using this condition, a diamond film which includes boron with the concentration of about $1.0 \times 10^{19}$ to about $1.0 \times 10^{21}/cm^3$ can be obtained by CVD.

In the present invention, holes, which have been injected from the electrode for hole injection and transported through the hole drift layer to the organic light emitting layer, and electrons, which have been injected from the electrode for electron injection and transported to the organic light emitting layer, recombine in the organic light emitting layer to induce light emission. In the present invention, the boron concentration in the diamond film for the hole drift layer is optimized. Therefore, the crystal defects in the diamond film are suppressed and the hole life time can be improved. As a result, the light emitting efficiency from the organic light emitting layer is improved. With properly defined thickness and orientation of crystals in the diamond layer for the hole drift layer, a high light emitting efficiency can be achieved.

BRIEF DESCRIPTION OF THE DRAWINGS

FIG. 1 shows a cross-sectional view of the organic LED according to the example of the present invention.

FIG. 2 shows the relationship between the brightness and the wavelength of the organic LED according to the present invention.

Figure 3:
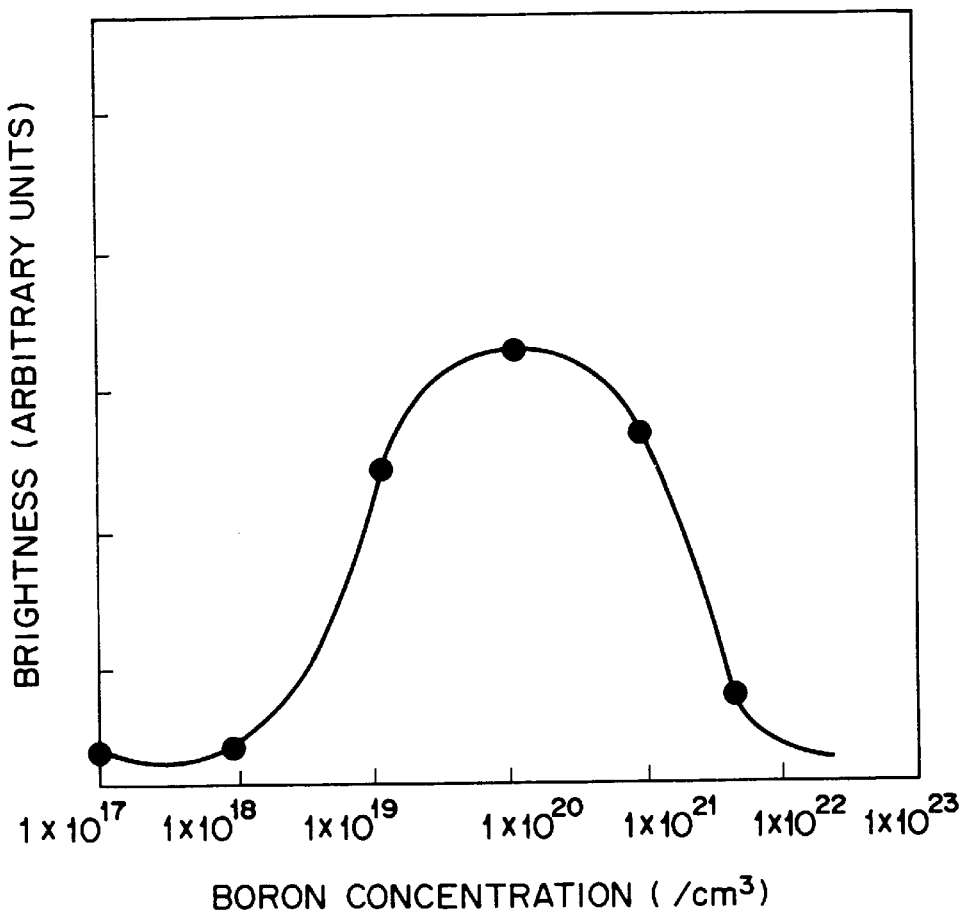
FIGS. 3 shows the relationship between the brightness of the organic LED and the boron concentration of diamond film.
Figure 4:
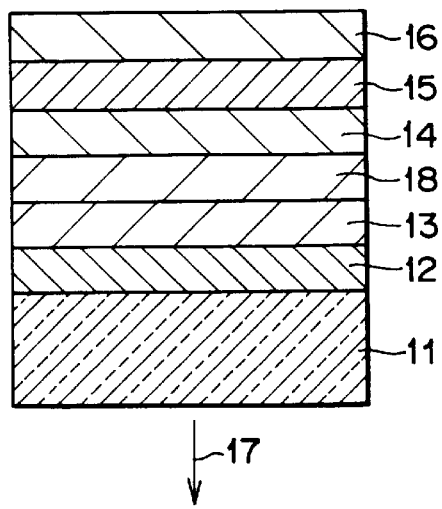
FIG. 4 shows a cross-sectional view of the organic LED of the Prior Art.

In the FIGS., 2 and 12 refer to an electrode for hole injection, 3 and 13 refer to a hole drift layer, 4 and 14 refer to an organic light emitting layer, 5 and 15 refer to an electron drift layer, 6 and 16 refer to an electrode for electron injection, 7 and 17 refer to emitted light, 8 refers to a transparent plate, 9 refers to a substrate and 11 refers to a glass substrate.

DETAILED DESCRIPTION OF THE PREFERRED EMBODIMENTS

FIG. 1 shows a cross-sectional view of the organic LED according to the example of the present invention. As shown in FIG. 1, an electrode for hole injection 2 is formed on a substrate 9 and a hole drift layer 3 composed of a diamond film in which B concentration is $1.0 \times 10^{19}$ to $1.0 \times^{21}/cm^3$ is formed on the electrode for hole injection. On the hole drift layer 3, an organic light emitting layer 4, an electron drift layer 5, and an electrode for electron injection 6 are deposited successively, and a transparent layer 8 is formed on it In the organic LED configured as above, holes injected from the electrode for hole injection 2 are transported through the hole drift layer 3 to the organic light emitting layer 4. Electrons injected from the electrode for electron injection 6 are also transported through the electron drift layer 5 to the organic light emitting layer 4. Then, these holes and electrons recombine in the organic light emitting layer 4 and light 7 is emitted from the side of the transparent plate 8. In the present example, a B concentration in the diamond film composing the hole drift layer 3 is optimized. Therefore, the crystal defects in the diamond film are minimized and the hole drift efficiency is improved. These factors are found to greatly improve the light emission efficiency from the organic light emitting layer 4.

The relation between the B concentration defined in the present invention in the diamond film and the light emission efficiency of the LED will be explained further. When the B concentration in the diamond film is less than about $1.0 \times 10^{19}/cm^3$, the electrical resistance of the diamond layer is extremely high, and a high voltage is needed to cause an emission from the organic, light emitting layer 4. Thus, the electric power loss is high. On the other hand, the electrical resistance of the diamond film (the hole drift layer 3) is lowered with increasing B concentration in the diamond film. However, non-diamond components, such as graphite or non-crystal carbon, as well as crystal defect density increase significantly with increasing the B concentration, in particular, when the B concentration is higher than about $1.0 \times 10^{21}/cm^3$, the grain size of diamond in the film becomes small, the density of grain boundaries increases, and the crystallinity of diamond is lowered. As a consequence, the resistance to high temperature of the diamond film is weakened, the carrier mobility is lowered, and hence the light emission efficiency is lowered. Therefore, the 13 concentration in the diamond film composing the hole drift layer 3 should be between about $1.0 \times 10^{19}$ and about $1.0 \times 10^{21}/cm^3$.

As stated above, in the present example, the B concentration in the diamond film composing the hole drift layer 3 is optimized, and thus the organic LED according to the present invention has an excellent light emission efficiency. The most suitable film thickness of the diamond film depends on the B doping concentration. The present inventors discovered that much better light emission efficiency can be achieved by optimizing the thickness of the diamond film in which the B concentration is defined as described above. The relationship between the film thickness of the diamond film and the light emission efficiency of the organic LED will be described below.

When the film thickness of the diamond film is greater than 5 $\mu$m, the electric resistance becomes too high and an electric power loss occurs. On the other hand, if the film thickness of the diamond film is less than 0.5 $\mu$m, the density of grain boundaries is too high and hence the trapping or annihilating centers. Thus, the light emission efficiency is reduced in such cases. In the present invention, it is found that the thickness of the diamond film should be between about 0.5 and about 5 $\mu$m.

It is further preferred that the orientation of the crystals composing the diamond film should be optimized to obtain a low resistance hole drift layer with a high carrier mobility. It means that polycrystalline diamond film, in which the crystal orientation is random, is least preferable. Diamond films with high quality and low resistance can be obtained by aligning (111), (100), or (110) crystallographic planes of the diamond crystals in a polycrystalline film normal to the surface of the film. It is most preferred that the diamond film is a single crystal with the (111), (100) or (110) crystallographic plane of the crystal composing the diamond film oriented parallel to the surface of the diamond film. In particular, if the (111) face of the crystal composing the diamond film is oriented parallel to the surface of the film, the lowest resistance can be achieved, because the (111) face can incorporate B atoms most easily.

The present inventors discovered that in order to maximize the light emission efficiency of the organic LED, it is necessary to properly control the number of electrons and holes injected from the electrodes for electron and hole injection, respectively. To this end, it is effective to form a lightly boron-doped layer, in which the B concentration is less than that of the diamond film composing the rest of the hole drift layer 3, on the surface of the diamond layer. If the film thickness of the lightly B-doped layer is greater than 1 $\mu$m, the resistance becomes too high to control the number of holes and electrons properly. Therefore, the film thickness must be less than about 1 $\mu$m.

Further, the present inventors discovered that in order to improve hole injection efficiency to the organic light emitting layer 4, it is effective to chemically modify the surface of the diamond film of the hole drift layer 3. It is preferred that the most suitable method for the chemical modification of the diamond film surface is chosen according to the purpose of LED application. As for the method of chemical modification, hydrogenation, oxidation, or halogenation is possible. As for other methods, it is possible to attach certain chemical compounds to the diamond film surface such as hydroxyl group, cyano group, amino group, carboxy group, sulfate group, nitro group, azo group, diazo group, and other higher molecular-weight compound.

As the substrate 9 to deposit high quality and low resistance diamond film described above, one kind substrate chosen from the group of silicon, silicon nitride, silicon carbide, alumina, silicon oxide, aluminum nitride, or metals which is resistant to high temperature can be used. Even if the diamond film can not be deposited directly on the base material, high quality and low resistance diamond film can be formed on various base materials on which at least one kind of film of the above materials has been deposited.

As described above, in the present invention, the hole drift layer 3 with superior characteristics is formed by controlling the B concentration and the thickness of the diamond film, and hence the light emission efficiency of the organic LED can be greatly improved.

In the present example shown in FIG. 1, the electron drift layer 5 is formed between the organic light emitting layer 4 and the electrode for electron injection 6. However, note that the electron drift layer 5 in the present invention can be omitted depending on the specification. It is possible to form the hole injection layer between the hole drift layer 3 and the organic light emitting layer 4, In the present invention, Pt, Mo, or other metals which are resistant to high temperature can be used as a material of the electrode for hole injection 2. As the organic compound composing the organic light emitting layer 4, distyreallylene group, oxadiazole group, pyrazoloquinoline group, benzooxazole Zn compound group, and aluminum chelate compound can be used. It is also possible to use polymer groups, such as polyalkylthiophene, polyparaphenylenevinylene, polynaphthalenevinylene, polyalkylfluorene, polyphenylene, and polymethylphenylsilane. As the electron drift layer 5, a material film such as aluminum chelate group can be used. As the electrode for electron injection 6, a transparent oxide electrode film such as ITO can be used.

In the present invention, it is not necessary that the transparent plate 8 is resistant to high temperature, because the diamond film composing the hole drift layer 3 is formed on the substrate 9. For example, a plastic plate or a glass plate can be used as the transparent plate 8. Instead of attaching a plastic plate or a glass plate on the electrode for electron injection 6, a glass film or a plastic film can be formed by coating on the surface of the electrode for electron injection 6.

The organic LED according to the present invention is used for a single LED unit for display, a back-light for liquid crystal display, or a light source of flat light. A flat panel display can be formed by integrating the organic LEDs.

EXAMPLES

The present invention is more particularly described by way of the following nonlimiting examples.

Example 1

As for the substrate 9 shown in FIG. 1, a silicon substrate coated by silicon oxide film or a silicon nitride substrate can be used. At first, a Pt film as an electrode for hole injection 2 can be deposited on the substrate. The nucleation density of diamond can be increased to $10^8$–$10^{10}/cm^2$ by ultrasonic treatment of the substrate for three minutes in the alcohol solution mixed with diamond powder. Then, a p-type diamond thin film of 1 $\mu$m thickness is deposited by microwave plasma CVD as a hole drift layer 3 on the electrode for hole injection 2. For the deposition, a source gas including 0.3 to 5 volume % methane, 0.1 to 2 vol. % oxygen, and 1 to 20 ppm diborane ($B_2H_6$) is used as a source gas. The substrate temperature is 800 to 850° C. and the gas pressure is 30 to 60 Torr.

After the deposition the synthesized diamond film is examined by SIMS (Secondary Ion Mass Spectrometry). As a result, the concentration of B atoms in the diamond film is between $1.0\times10^{19}$ ad $1.0\times10^{21}/cm^3$. After that, an MDDO-PPV (poly(2-methoxy-5-dodecyloxy-1,4-phenylene vinylene)) film is spin coated as an organic light emitting layer 4 on the diamond film as the hole drift layer 3. On the organic light emitting layer 4, an aluminum thin film as an electrode for electron injection 6 is formed by vacuum evaporation. Then, a transparent plate 8 is formed on it. In the present example, the electron drift layer 5 is omitted.

By applying electric voltage between the electrode for hole injection 2 composed of a platinum film and the electrode for electron injection 6 composed of an aluminum thin film, the brightness of light emission is measured from the organic LED. FIG. 2 shows the brightness of the organic LED according to the present example against wave length. As shown in FIG. 2, a strong light emission is obtained when applied voltage was higher than 20 V between the electrode for hole injection 2 and the electrode for electron injection 6.

Example 2

In the same manner as in the example 1, organic LEDs are fabricated with various concentration of diborane gas in the source gas. Then, the relationship between the concentration of diamond films as the hole drift layer 3 and the brightness at the applied voltage higher than 20 V between the electrode for hole injection 2 and the electrode for electron injection 6 are investigated. The result is shown in FIG. 3. It is seen that the light emission took place when the B concentration in the diamond film was between $1.0\times10^{19}$ to $1.0\times10^{21}/cm^3$.

Example 3

At first, a single crystalline (111) platinum film as an electrode for hole injection 2 is formed by sputtering on the substrate composed of a single crystalline strontium titanate which had (111) crystal face. A single crystalline diamond film whose surface consists of coalesced (111) crystal faces of diamond grains is obtained by CVD. Subsequently, an organic LED is fabricated in the same manner as in Example 1 and the brightness of light emission is observed by applying voltage between the electrode for hole injection 2 and the electrode for electron injection 6. As a result, a light emission as strong as that shown in FIG. 2 is obtained when the applied voltage between the electrode for hole injection 2 and the electrode for electron injection 6 is higher than 5 V. In this example 3, the light emission efficiency is improved over Example 1, because the hole drift layer 3 is composed of a single crystalline diamond film in which (111) crystal face is oriented parallel to the surface of the diamond film.

As is apparent from the foregoing examples, organic LEDs which can stably emit light with improved efficiency can be obtained according to the present invention and embodiment, because the B concentration in the diamond film composing the hole drift layer is optimized. Moreover, the light emission efficiency can be improved, if the thickness and the crystal orientation of the diamond film composing the hole drift layer is optimized. A drift efficiency of hole from the hole drift layer to the organic light emitting layer and hence the light emission efficiency can be improved, if a lightly boron-doped layer of proper thickness is formed on the surface of the diamond layer and the surface of the diamond layer is chemically modified.

The disclosure of the priority document, Patent Application No. Hei 9-349537, filed in Japan on Dec. 18, 1997, is incorporated herein by reference in its entirety.

What is claimed is:

1. An organic LED comprising, in order, a substrate, a hole injection electrode layer, a hole drift layer, an organic light emitting layer, and an electron injection electrode layer, wherein the hole drift layer comprises a diamond film having a boron concentration of from about $1.0\times10^{19}$ to about $1.0\times10^{21}$ atoms/$cm^3$.

2. The organic LED according to claim 1, wherein the diamond film has a thickness of between about 0.5 $\mu$m and about 5 $\mu$m.

3. The organic LED according to claim 1, wherein the diamond film has a (111), (100) or (110) crystallographic plane oriented normal to a surface of the diamond film.

4. The organic LED according to claim 1, wherein
the diamond film is a polycrystalline film having a surface and comprising a first crystal and a second crystal;
the first crystal has a first crystallographic plane, which is selected from a group consisting of (111), (100) and (110) crystallographic planes and which is oriented normal to the surface of the polycrystalline film; and
the second crystal has a second crystallographic plane, which is selected from a group consisting of (111), (100) and (110) crystallographic planes and which is oriented parallel to the surface of the polycrystalline film.

5. The organic LED according to claim 1, wherein the hole drift layer comprises a single crystalline diamond film having a crystallographic plane, which is selected from a group consisting of (111), (100) and (110) crystallographic planes and which is oriented parallel to a surface of the diamond film.

6. The organic LED according to claim 1, wherein the diamond film comprises a surface layer less than about 1 $\mu$m thick having a boron concentration less than the boron concentration of the diamond film.

7. The organic LED according to claim 1, wherein the diamond film comprises a surface in contact with the organic light emitting layer, and the surface is at least one of a hydrogenated surface, an oxidized surface and a halogenated surface.

8. The organic LED according to claim 1, wherein the diamond film comprises a surface in contact with the organic light emitting layer, and at least one of hydrogen, oxygen, a halogen, a hydroxyl group, a cyano group, an amino group, a carboxyl group, a sulfate group, a nitro group, an azo group and a diazo group is bonded to the surface.

9. The organic LED according to claim 1, wherein the substrate comprises a material selected from a group consisting of silicon, silicon nitride, silicon carbide, alumina, aluminum nitride and metals.

10. The organic LED according to claim 1, wherein the substrate comprises a base material and a film on the base material, and the film comprises a material selected from a group consisting of silicon, silicon nitride, silicon carbide, alumina, aluminum nitride and metals.

11. A method for producing an organic LED, a method comprising forming a hole injection electrode layer on a substrate, forming a hole drift layer on the hole injection electrode layer, forming an organic light emitting layer on the hole drift layer, and then forming an electron injection electrode layer, wherein the hole drift layer is formed by depositing a diamond film by microwave chemical vapor deposition using a source gas including diborane ($B_2H_6$), and the hole drift layer comprises a diamond film having a boron concentration of from about $1.0 \times 10^{19}$ to about $1.0 \times 10^{21}$ atoms/cm$^3$.

12. The method according to claim 11, wherein a concentration of the diborane in the source gas is between about 1 and about 20 ppm by volume.

* * * * *